United States Patent
Hong et al.

[19]

[11] Patent Number: 6,130,443
[45] Date of Patent: Oct. 10, 2000

[54] LIQUID CRYSTAL DISPLAY HAVING WIRES MADE OF MOLYBDENUM-TUNGSTEN ALLOY AND A METHOD OF MANUFACTURING THE SAME

[75] Inventors: Mun-Pyo Hong; Young-Jae Tak, both of Kyungki-do, Rep. of Korea

[73] Assignee: Samsung Electronics Co., Ltd., Suwon, Rep. of Korea

[21] Appl. No.: 09/170,100

[22] Filed: Oct. 13, 1998

[30] Foreign Application Priority Data

Oct. 13, 1997 [KR] Rep. of Korea ........................ 97-52291

[51] Int. Cl.[7] .................................................. H01L 29/00
[52] U.S. Cl. ............................ 257/59; 257/347; 257/348; 257/349; 257/350; 257/351; 257/352; 257/353; 257/72
[58] Field of Search ........................ 257/59, 72, 347–355

[56] References Cited

U.S. PATENT DOCUMENTS 5,539,551  7/1996  Nomoto et al. ............................ 257/59
5,942,767  8/1999  Na et al. ................................... 257/59

*Primary Examiner*—Fetsum Abraham
*Attorney, Agent, or Firm*—Howrey Simon Arnold & White, LLP

[57] ABSTRACT

A liquid crystal display has wires made of aluminum alloy layer, and two molybdenum-tungsten alloy layers MoW located on/under the aluminum alloy layer, respectively. To form a wire, the first molybdenum-tungsten alloy layer, the aluminum alloy layer, and the second molybdenum-tungsten alloy layer are sequentially deposited. The molybdenum-tungsten alloy layer has different etch rates for one etchant, depending on the deposition temperature and tungsten content ratio. Particularly, since the molybdenum-tungsten alloy layer has an etch rate similar to that of an aluminum layer and aluminum alloy layer for an aluminum etchant $CH_3COOH/HNO_3/H_3PO_4/H_2O$. Therefore, the first molybdenum-tungsten alloy layer having a lower etch rate than that of the aluminum layer or the aluminum alloy layer, and the second molybdenum-tungsten alloy layer having a higher etch rate than that of the aluminum layer or the aluminum alloy layer may be formed by adjusting deposition temperature and tungsten content ratio. Accordingly, the wires have a gradually sloped taper angle.

9 Claims, 4 Drawing Sheets

LIQUID CRYSTAL DISPLAY HAVING WIRES MADE OF MOLYBDENUM-TUNGSTEN ALLOY AND A METHOD OF MANUFACTURING THE SAME

BACKGROUND OF THE INVENTION (1) Field of the Invention

The present invention relates to a liquid crystal display using wires made of molybdenum-tungsten alloy (MoW) and a method of manufacturing the same.

(2) Description of the Related Art

Wires of a liquid crystal display such as a gate line transmitting scanning signals or a data line transmitting image signals are made of the materials having low resistivity such as aluminum (Al) or chromium (Cr). Chromium, which has good ohmic contact properties with an ITO (indium tin oxide) and amorphous silicon, is generally used as the data line, despite its higher resistivity than aluminum.

However, the strong adhesion of the chromium layer to the photoresist layer creates a chromium layer patterned to have a taper angle of nearly 90°. Accordingly, a passivation layer and an ITO layer, subsequently formed on the chromium layer also have a nearly vertical taper angle, which results in inferior layer characteristics.

Furthermore, the difficulty of the Cr layer to control the stress caused by its deposition thickness makes it harder to form a narrow and thick wire of low resistivity.

SUMMARY OF THE INVENTION

In view of the above, it is an object of the present invention to provide multi-layered wires of a low resistivity, each layer of which has a similar etch rate under similar conditions.

It is another object of the present invention to simplify the manufacturing process of a display by using the multi-layered wires to improve its quality.

A wires according to the present invention has a triple-layered structure either having a taper angle in the range of 20–70° when manufactured under the same etching condition or having an incremental etch rate toward the upper layer under the same etching condition. The etch rate may be controlled by adjusting the deposition temperature or the material composition.

When the wire is wet-etched, only one etchant may be used.

The middle conductive layer of the triple-layered structure is made of a material having a low resistivity under 15 $\mu\Omega$m. Aluminum or an aluminum alloy is used as the middle conductive layer of the triple-layered structure. The upper and lower conductive layers are made of a MoW alloy comprising tungsten, molybdenum and inevitable impurities.

The above-described etchant is an etchant for aluminum or an aluminum alloy, which includes $CH_3COOH/HNO_3/H_3PO_4/H_2O$. It is preferable that the concentration of $HNO_3$ is 8 to 14%.

As the deposition temperature of the MoW alloy layer becomes higher, the etch rate of the MoW alloy layer increases, and as the content of the tungsten in the MoW alloy layer becomes lower, the etch rate of the MoW alloy layer increases to perform a tapered etching. Accordingly, wires with a taper angle may be obtained by adjusting the deposition temperature or the material composition.

In particular, a method of manufacturing the wires according to the present invention includes the step of depositing a lower MoW alloy layer, an Al layer or an Al alloy layer, and an upper MoW alloy layer, which layers are sequentially deposited on an insulating substrate. Next, the upper MoW alloy layer, the Al layer or the Al alloy layer, and the lower MoW alloy layer are sequentially patterned to form a wire using an etchant.

In a manufacturing method of a thin film transistor (TFT) substrate according to the present invention, a data wires including a source electrode, a drain electrode and a data line is made of triple conductive layers of a MoW alloy layer comprising tungsten, molybdenum and inevitable impurities, an aluminum layer or an aluminum alloy layer, and a MoW alloy layer.

DETAILED DESCRIPTION OF THE PREFERRED EMBODIMENTS

Figure 1:
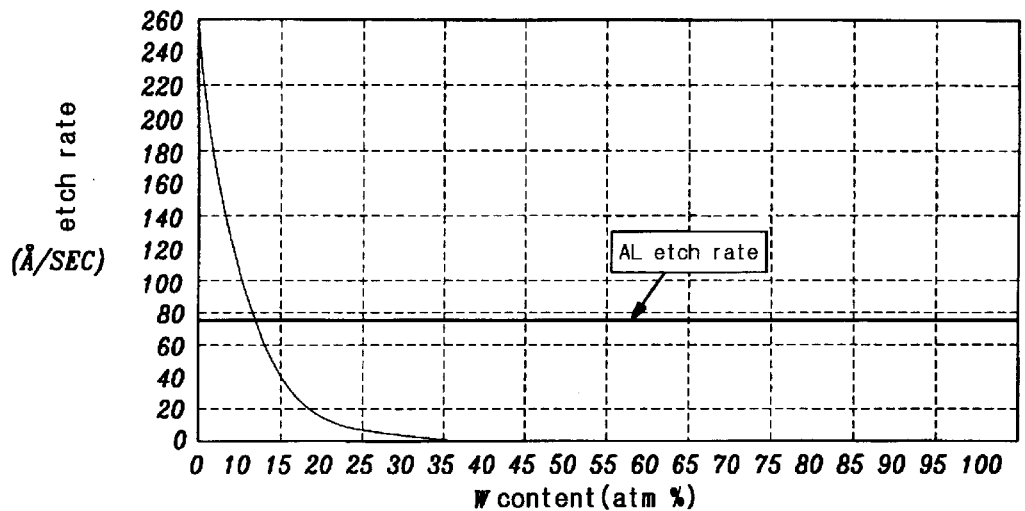
FIG. 1 is a graph illustrating the etch rate of a MoW layer as a function of the content ratio of tungsten according to an embodiment of the present invention.

The present invention now will be described more fully hereinafter with reference to the accompanying drawings, in which preferred embodiments of the invention are shown. In the drawings, the thickness of layers and regions are exaggerated for clarity. Like numbers refer to like elements throughout. It will be understood that when an element such as a layer, region or substrate is referred to as being "on" another element, it can be formed directly on the other element or intervening elements may also be present. In contrast, when an element is referred to as being "directly on" another element, there are no intervening elements present.

Wires of a display are made of a material, with a resistivity lower than 15 $\mu\Omega$cm, such as aluminum, aluminum alloy, molybdenum and copper. These wires generally include pads for receiving external electrical signals. The pads should not be easily opened during manufacturing processes, and should not be oxidized when exposed. Aluminum or an aluminum alloy has a very low resistivity, but is not suitable for a pad because it can be easily opened and is vulnerable to oxidization. On the contrary, chromium, a tantalum, titanium, molybdenum and their alloys are suitable for a pad, but they have a resistivity higher than that of aluminum. Accordingly, it is desirable that a wire is made of either a material having both properties or that it has a multi-layered structure including a conductive layer having a low resistivity and another conductive layer for a pad.

When the wires are formed of triple layers, it is desirable that the layers are etched under the same etching condition, in particular, by using the same etchant and tapered to have a slanted profile. To form a wire, it is desirable that the triple layers have an increasing etch rate toward the upper layer under the same etch condition to form a taper angle in the range of 20–70°.

Wires of a triple-layered structure including the middle conductive layer made of Al or Al alloy and the upper and lower conductive layers made of a MoW alloy comprising tungsten, molybdenum and inevitable impurities are developed.

First, the etch rate characteristics of a MoW alloy layer for an aluminum etchant is described in detail.

FIG. 1 shows an etch rate characteristic of a MoW alloy layer according to an embodiment of the present invention. The horizontal axis indicates a tungsten content in atomic (atm) %, and the vertical axis indicates etch rates of a MoW alloy layer and an Al layer in Å/sec for an etchant for aluminum.

The this etch rate is an aluminum etchant, $CH_3COOH/HNO_3/H_3PO_4/H_2O$.

As shown in FIG. 1, the etch rate of a pure Mo layer is measured for higher than 220 Å/sec, but the etch rate of a MoW alloy layer including tungsten of 10 to 15 atm % is in the range of 40 to 100 Å/sec. The etch rate of a MoW alloy layer including tungsten of 15 to 20 atm % is less than 10 to 40 Å/sec.

On the other hand, a thin layer of an aluminum or an aluminum alloy which has a low resistivity has an etch rate in the range of 60–80 Å/sec for the etchant $CH_3COOH/HNO_3(8$ to $14\%)/H_3PO_4/H_2O$. Therefore, by adjusting the tungsten content ratio, the molybdenum alloy layers of a higher etch rate and of a lower etch rate than that of an aluminum layer or an aluminum alloy layer may be obtained. Furthermore, a triple-layered wire including the aluminum or aluminum alloy layer and the molybdenum alloy layers may be formed, and this wire is patterned using the aluminum etchant to have a smooth slope.

Figure 2:
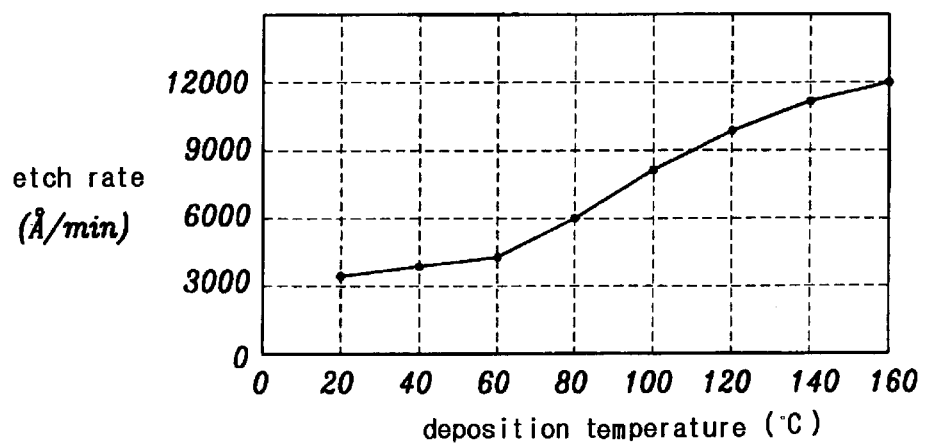
FIG. 2 is a graph illustrating the etch rate of a MoW layer as a function of deposition temperature according to an embodiment of the present invention.

FIG. 2 shows an etch rate characteristic of a MoW alloy layer for the aluminum etchant according to the deposition temperature. The horizontal axis represents a deposition temperature, and the vertical axis indicates an etch rate in Å/min for an aluminum etchant.

That is, FIG. 2 shows the etched thickness per unit time of the MoW alloy layers, which are deposited at different temperatures, in Å/min for an aluminum etchant $CH_3COOH/HNO_3/H_3PO_4/H_2O$. Here, the tungsten content is about 10 atm %.

As shown in FIG. 2, the etch rate of the MoW alloy layer of the deposition temperature 20° C. is about 3,000 Å/min, and its etch rate increases as the deposition increases temperature in the range of 20 to 160° C. The etch rate at the deposition temperature 160° C. is about 12,000 Å/min.

On the other hand, a thin layer of an aluminum or an aluminum alloy which has a low resistivity has an etch rate in the range of 3,600–4,800 Å/min for the etchant $CH_3COOH/HNO_3(to\ 14\%)/H_3PO_4/H_2O$ as described above. Therefore, by adjusting the deposition temperature, the molybdenum alloy layers having a higher etch rate and a lower etch rate than an aluminum layer or an aluminum alloy layer can be obtained. Furthermore, a triple-layered wire including the aluminum or aluminum alloy layer and the molybdenum alloy layers may be formed patterned at once by using an aluminum etchant to have a smooth slope.

The wires can be used as a gate line or a data line of a liquid crystal display.

A TFT substrate having a wire of the triple-layered structure including a MoW alloy layer/Al alloy layer/MoW alloy layer will now be described specifically with reference to FIGS. 3 and 4.

Figure 3:
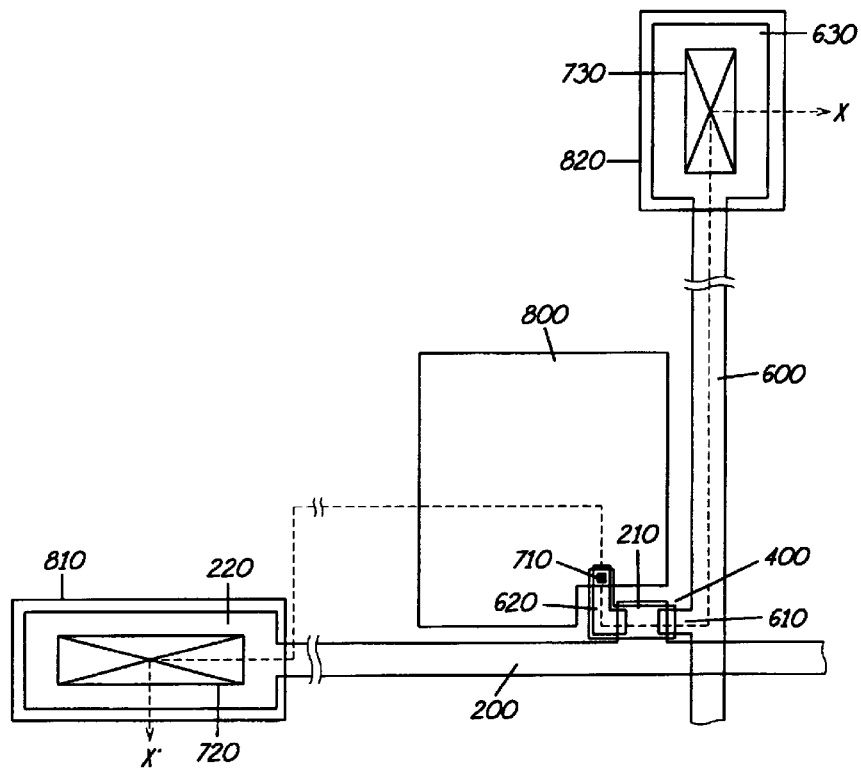
FIG. 3 shows a layout view of a TFT substrate according to an embodiment of the present invention.
Figure 4:
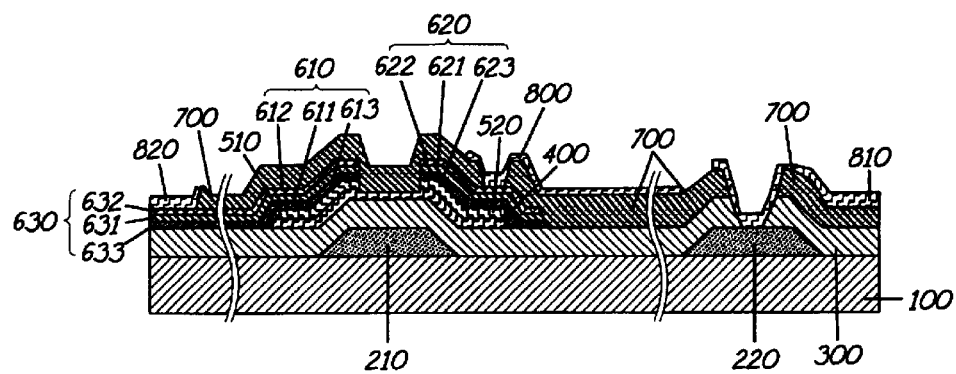
FIG. 4 shows a sectional view of a TFT substrate taken along the line IV–IV' in FIG. 3.

FIG. 3 shows a layout view of a TFT substrate according to an embodiment of the present invention, and FIG. 4 shows a cross-sectional view taken along the line IV–IV' in FIG. 3.

A gate pattern including a gate line 200, a gate electrode 210 which is a branch of the gate line 200 and a gate pad 220 which is connected to the one end of the gate line 200 is formed on a substrate 100.

A gate insulating layer 300 having a contact hole 720 exposing the gate pad 220 covers the gate pattern 200, 210 and 220. A hydrogenated amorphous silicon (a-si:H) layer 400 and a doped hydrogenated amorphous silicon layer 510 and 520 including N type impurities are sequentially formed on the portion of the gate insulating layer 300 above the gate electrode 210, and the portions 510 and 520 of the doped amorphous silicon layer are facing each other with respect the gate electrode 210.

A data line 600 crossing the gate line 200 is formed on the gate insulating layer 300, a data pad 630 for transmitting the image signals from the outside to the data line 600 is connected to one end of the data line 600. A source electrode 610 which is a branch of the data line 600 is formed on one portion 510 of the doped amorphous silicon layer, and a drain electrode 620 opposite the source electrode 610 with respect to the gate electrode 210 is formed on the other portion 520 of the doped amorphous silicon layer. Here, the data pattern including the data line 600, the source and drain electrode 610 and 620, and the data pad 630 is formed of a middle layer 611, 621 and 631 of Al or Al alloy, and a lower layer 612, 622 and 632 and an upper layer 613, 623 and 633 of MoW alloy comprising tungsten and molybdenum.

A passivation layer 700 is formed on the data pattern 600, 610, 620 and 630 and the amorphous silicon layer 500 which is not covered by the data pattern. The passivation layer 700 has contact holes 710, 730 and 720 exposing the upper MoW alloy layer 622 and 632 of drain electrode 620 and the data pad 630, and the gate pad 220, respectively.

Finally, a pixel electrode 800 formed of ITO (indium tin oxide) and connected to the drain electrode 620 through a contact hole 710 is formed on the passivation layer 700. Furthermore, a data ITO layer 820 connected to the data pad 630 through the contact hole 730 and transmitting image signals from outside to the data line 600, and a gate ITO layer 810 connected to the gate pad 220 through the contact hole 720 and transmitting scanning signals to the gate line 200 are formed on the passivation layer 700.

A method of manufacturing a TFT substrate will now be described specifically with reference to the attached drawings.

FIGS. 5A through 5D show cross sectional views illustrating a manufacturing method of a TFT substrate shown in FIG. 3 and FIG. 4 according to an embodiment of the present invention.

Figure 5A:
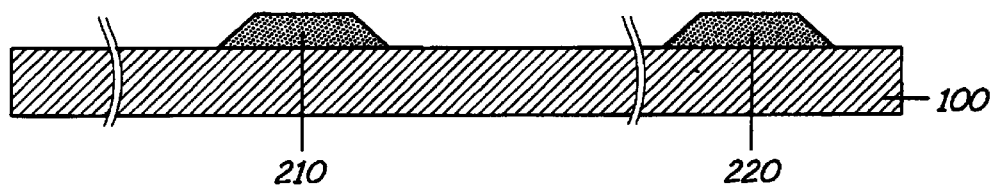
FIGS. 5A–5D are sectional views illustrating a manufacturing method of a TFT substrate shown in FIG. 4 according to an embodiment of the present invention.

As shown in FIG. 5A, an Al alloy layer made of Al and neodymium to a thickness of 1,000–3,000 Å is deposited on a transparent insulating substrate 100, and patterned to form a gate line 200, a gate electrode 210 and a gate pad 220 by photolithography using a first mask.

Figure 5B:
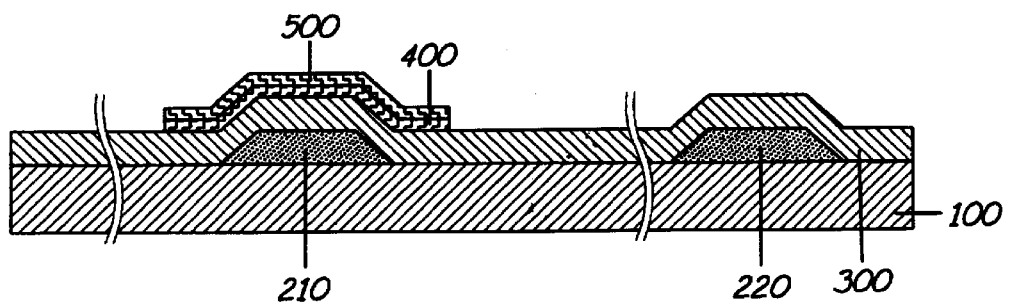

As shown in FIG. 5B, a gate insulating layer 300 with a thickness of 3,000–5,000 Å made from silicon nitride, a hydrogenated amorphous silicon layer 400 with a thickness of 1,000–3,000 Å and an extrinsic or doped hydrogenated amorphous silicon layer 500 highly doped with N type impurity having a thickness of 200–1,000 Å are sequentially deposited by plasma-enhanced chemical vapor deposition (PECVD hereafter). The amorphous silicon layer 400 and the extrinsic amorphous silicon layer 500 are patterned by photolithography using a second mask.

Figure 5C:
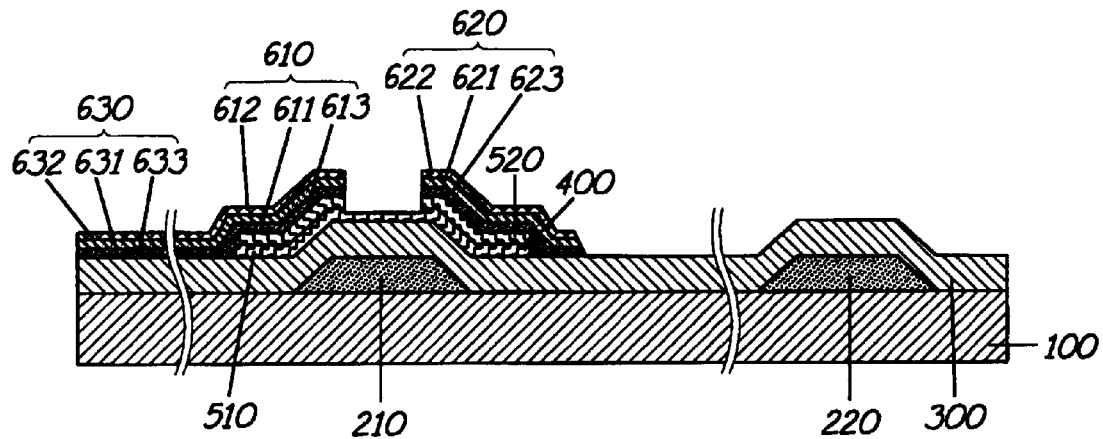

As shown in FIG. 5C, a lower layer made of MoW alloy, a middle layer made of Al or Al alloy, and an upper layer of MoW alloy are sequentially deposited and patterned to form a data pattern including a data line 600, a source electrode 610, a drain electrode 620, a data pad 630 by photolithography with an Al etchant using a third mask.

The Al etchant used in this step includes $CH_3COOH$, $HNO_3$, $H_3PO_4$ and $H_2O$, and the density of $HNO_3$ is 8–14%. Here, the lower molybdenum alloy layer 613, 623 and 633 has a smaller etch rate than the upper molybdenum alloy layer 612, 622 and 632 by adjusting the deposition temperature or the content ratio of tungsten. Furthermore, the upper molybdenum alloy layer 612, 622 and 632, an aluminum alloy layer 611, 621 and 631, and the lower molybdenum alloy layer 813, 623 and 633 have a sequentially increasing etch rate for aluminum etchant.

Accordingly, since the etch rate of an aluminum alloy layer 611, 621 and 631 for an aluminum etchant are in the range of 60 to 80 Å/sec, it is preferable that the lower molybdenum alloy layer 613, 623 and 633 is deposited at the temperature in the range of 50 to 150° C., and the upper molybdenum alloy layer 612, 622 and 632 is deposited at a temperature higher than 150° C., in case of 10 atm % of tungsten content. In addition, it is preferable that the lower molybdenum alloy layer 613, 623 and 633 has tungsten content of equal to or more than 10 atm %. and the upper molybdenum alloy layer 612, 622 and 632 has tungsten content of equal to or less than 10 atm %.

It is preferable that the thickness of the upper and lower molybdenum alloy layer 612, 622, 632, and 613, 623, 633 is in the range of 400 to 1,500 Å, and the thickness of the aluminum alloy layer 611, 621 and 631 is in the range of 1,500 to 4,000 Å, more preferably, 400 to 600 Å and 1,800 to 2,500 Å, respectively.

Then, the doped amorphous silicon layer 500, which is exposed, is etched into two portions with respect to the gate electrode 210, and to expose the central portion of the amorphous silicon layer 400.

Figure 5D:
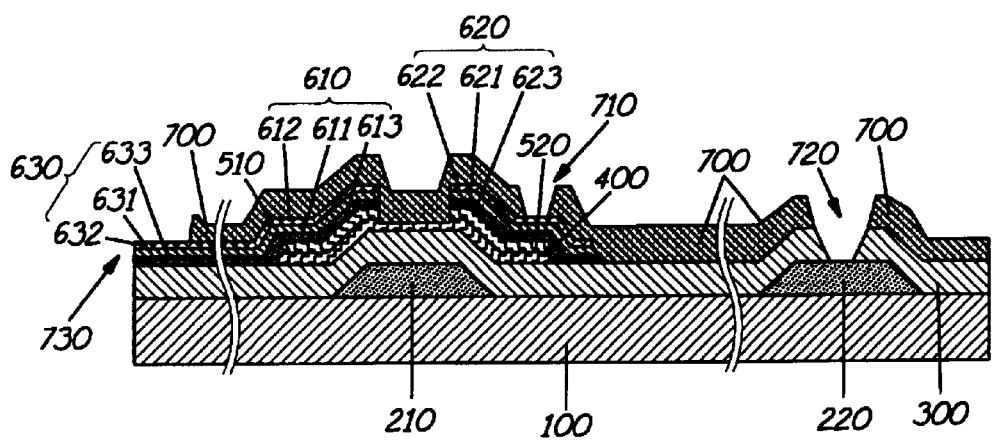

As shown in FIG. 5D, a passivation layer 700 with a thickness of 2,000–5,000 Å is deposited and patterned along with the gate insulating layer 300 by photolithography using a fourth mask to form a contact hole 710 on the upper layer 622 of MoW of the drain electrode 620, a contact hole 720 on the gate pad 220, and a contact hole 730 on the upper layer 632 of MoW of the data pad 630.

Finally, an ITO layer of a thickness of 300–1,500 Å is deposited and patterned by photolithography using a fifth mask to form a pixel electrode 800 connected to the drain electrode 620 through contact hole 710, a gate ITO layer 810 connected to the gate pad 220 through contact hole 720, and a data ITO layer 820 connected to the data pad 630 through contact hole 730, as shown in FIG. 4.

According to the method for manufacturing the liquid crystal display of the present invention, the data pattern of triple layers consisting of MoW alloy layer and Al layer or Al alloy layer has a low resistivity and a slowly tapered angle. Also, since one etchant for aluminum etches the triple layers of the data pattern, the etch process is simplified. Furthermore, a good contact property with an ITO (indium tin oxide) or amorphous silicon of the upper and lower MoW layers improves, the quality of the liquid crystal display. Thus, the wires of the triple layers including MoW may be used for the signal lines of a large scale and high quality display device, since the triple layer wire enables to form a narrow and thick line.

In the drawings and specification, typical preferred embodiments of the present invention have been disclosed and, although specific terms are employed, they are used in a generic and descriptive sense only and not for the purposes of limitation, the scope of the invention being set forth in the following claims.

What is claimed is:

1. A thin film transistor array panel for a liquid crystal display comprising:
    a gate pattern including a gate line, a gate electrode and a gate pad formed on a transparent substrate;
    a gate insulating layer covering the gate pattern;
    an amorphous silicon layer formed on the gate insulating layer over the gate electrode;
    a data pattern including a data line, a data pad and a source and a drain electrode which is formed on the gate insulating layer and the amorphous silicon layer and made of triple layers having a lower layer of molybdenum-tungsten alloy, a middle layer of aluminum or aluminum alloy, and an upper layer of molybdenum-tungsten alloy; and
    a pixel electrode connected to the drain electrode.

2. The thin film transistor array panel as claimed in claim 1, wherein the thicknesses of the lower and the upper layers are 400 to 1,500 Å.

3. The thin film transistor array panel as claimed in claim 1, wherein the thicknesses of the lower and the upper layers are 400 to 600 Å.

4. The thin film transistor array panel as claimed in claim 1, wherein the thickness of the middle layer is 1,500 to 4,000 Å.

5. The thin film transistor array panel as claimed in claim 1, wherein the thickness of the middle layer is 1,800 to 2,500 Å.

6. The thin film transistor array panel as claimed in claim 5, wherein the tungsten content ratio of the lower and the upper layers are not equal.

7. The thin film transistor array panel as claimed in claim 6, wherein the tungsten content ratio of the lower layer is higher than the tungsten content ratio of the upper layer.

8. The thin film transistor array panel as claimed in claim 7, wherein the tungsten content ratio of the lower layer is equal to or greater than 10 atm %.

9. The thin film transistor array panel as claimed in claim 8, wherein the tungsten content ratio of the upper layer is less than 10 atm %.

* * * * *